United States Patent
Wu et al.

(10) Patent No.: US 9,355,882 B2
(45) Date of Patent: May 31, 2016

(54) TRANSFER MODULE FOR BOWED WAFERS

(71) Applicant: Taiwan Semiconductor Manufacturing Co., Ltd., Hsin-Chu (TW)

(72) Inventors: Ming-Tung Wu, Hsinchu (TW); Yuan-Chih Hsieh, Hsinchu (TW); Lan-Lin Chao, Sindian (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 89 days.

(21) Appl. No.: 14/096,217

(22) Filed: Dec. 4, 2013

(65) Prior Publication Data

US 2015/0155196 A1 Jun. 4, 2015

(51) Int. Cl.
| | |
|---|---|
| *H01L 21/683* | (2006.01) |
| *B24B 37/34* | (2012.01) |
| *H01L 21/687* | (2006.01) |
| *B24B 37/30* | (2012.01) |
| *B24B 41/00* | (2006.01) |
| *H01L 21/67* | (2006.01) |

(52) U.S. Cl.
CPC ............ *H01L 21/6838* (2013.01); *B24B 37/30* (2013.01); *B24B 37/345* (2013.01); *B24B 41/005* (2013.01); *H01L 21/67288* (2013.01); *H01L 21/68707* (2013.01); *H01L 21/68764* (2013.01); *H01L 21/68771* (2013.01)

(58) Field of Classification Search
CPC ........ B24B 5/355; B24B 37/04; B24B 37/30; B24B 37/345; B24B 41/005; B24B 41/061; H01L 21/6838; H01L 21/67288; H01L 21/68707; H01L 21/68764; H01L 21/68771
See application file for complete search history.

(56) References Cited

U.S. PATENT DOCUMENTS

| | | | |
|---|---|---|---|
| 6,280,308 B1 | 8/2001 | Ishikawa et al. | |
| 6,805,616 B2 | 10/2004 | Kawashima | |
| 6,846,224 B2* | 1/2005 | Ki ........................... | B24B 51/00 |
| | | | 451/278 |
| 6,863,590 B2* | 3/2005 | Kobayashi ............ | B24B 37/345 |
| | | | 451/287 |
| 6,910,943 B2* | 6/2005 | Ishikawa ................. | B24B 7/228 |
| | | | 257/E21.23 |
| 7,078,262 B2* | 7/2006 | Yamamoto ........ | H01L 21/67132 |
| | | | 257/E21.122 |
| 7,591,714 B2* | 9/2009 | Ko ........................ | B24B 37/345 |
| | | | 451/285 |
| 7,654,887 B2* | 2/2010 | Ishikawa ................. | B24B 37/30 |
| | | | 451/388 |

(Continued)

OTHER PUBLICATIONS

"Higher Throughput Grinder Polisher for 300mm Wafers"; Fully Automatic Grinder/Polisher DGP8761; DISCO Corporation; Dec. 2012; p. 1-2.

*Primary Examiner* — Timothy V Eley
(74) *Attorney, Agent, or Firm* — Eschweiler & Associates, LLC (57) ABSTRACT

A wafer grinding system includes a robot arm having a suction board at one end and a table within reach of the robot arm. An upper surface of the table has a vacuum surface for sucking and holding wafers. A pusher coupled to the robot arm extends about the periphery of the suction board. The pusher flattens wafers against the upper surface of the table, allowing the table to hold by suction wafers that would otherwise be too bowed to be held in that way. Additionally, a table can have a vacuum area that is small in comparison to the wafers, which is another way of increasing the magnitude of wafer bow that can be tolerated. A grinding system can use the reduced vacuum area concept to allow the positioning table to hold bowed wafers and the pusher concept to allow the chuck tables to hold bowed wafers.

20 Claims, 5 Drawing Sheets

(56) References Cited

U.S. PATENT DOCUMENTS

| | | | |
|---|---|---|---|
| 7,682,224 B2 * | 3/2010 | Kimura | B24B 37/04 257/E21.237 |
| 7,816,264 B2 | 10/2010 | Kajiyama et al. | |
| 8,357,435 B2 | 1/2013 | Lubomirsky et al. | |
| 8,647,171 B2 * | 2/2014 | Duescher | B24B 37/107 451/11 |
| 2009/0057840 A1 * | 3/2009 | Netsu | H01L 21/02024 257/618 |
| 2013/0138238 A1 | 5/2013 | Yang | |
| 2014/0091537 A1 * | 4/2014 | Iizuka | B23B 31/307 279/3 |
| 2015/0104999 A1 * | 4/2015 | Seki | B24B 37/10 451/28 |

* cited by examiner

TRANSFER MODULE FOR BOWED WAFERS

FIELD

The present disclosure relates to systems and methods for handling semiconductor wafers, especially in grinding systems.

BACKGROUND

Integrated circuit devices are formed on semiconductor wafers. It is common to grind the wafers to thin them immediately prior to dicing and packaging. Automatic grinders that are generally suitable for these applications are commercially available.

DETAILED DESCRIPTION

It has been observed that automatic grinders are generally unable to handle wafers that are bowed by more than 500 µm. The vacuum system used to hold wafers on the positioning table generally fails for wafers bowed upwards by 400 µm and the vacuum system used to hold wafers on the chuck tables generally fails for wafers bowed upwards by 480 µm. The present disclosure provides two solutions. One is to shrink the vacuum area of a table. The other is to augment a robot arm with pushers that increase contact between the wafers and the vacuum area of a table. While either solution can be used, a grinding system in which the shrunken vacuum area is applied for the positioning table and a robot arm with pushers is applied for the chuck table offers the best solution. Systems according to embodiments of the present disclosure can process wafers that bowed by more than 500 µm. In some embodiments, the systems can handle wafers that are bowed 900 µm and may tolerate even larger wafer bows.

Figure 1:
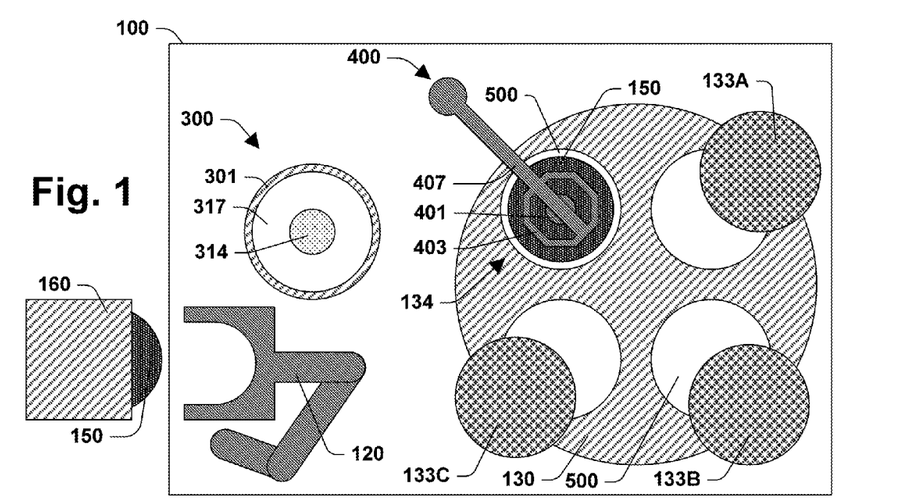
FIG. 1 illustrates a grinding system according to an embodiment of the present disclosure.

FIG. 1 illustrates a grinding system 100 that provides an example of a system according to one embodiment of the present disclosure. Although the examples use a grinding system, the wafer handling systems and methods provided by the present disclosure can be applied to any systems that uses automation to handle wafers. The grinding system 100 includes positioning table 300, robot pick 120, a robot 400, and a carrousel 130 carrying a plurality of chuck tables 500. Spindles 133A, 133B, and 133C are arranged above the carrousel 130 to provide coarse, medium, and fine grinding of wafers 150 held by chuck tables 500. As carrousel 130 rotates, chuck tables 500 switch positions. Robot 400 can load wafers 150 onto a chuck table 500 that is in the load position 134. Robot 400 can be used to unload wafers 150 from chuck table 500, but in most embodiments another robot (not shown) is provided for unloading.

Figure 2:
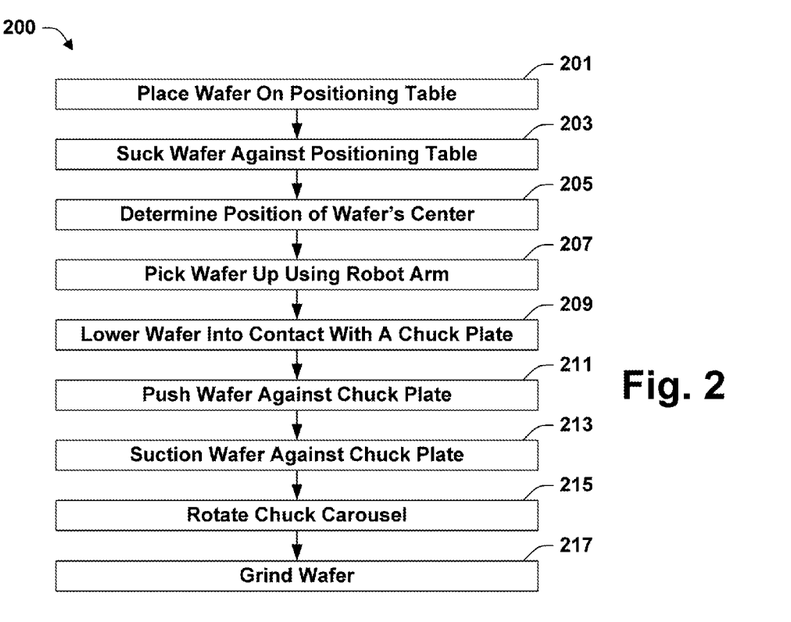
FIG. 2 is flow chart of a method according to another embodiment of the present disclosure FIG. 3 provides a cross-sectional view from the side of a positioning table according to an embodiment of the present disclosure with an upwardly bowed wafer placed on top of it.
Figure 3:
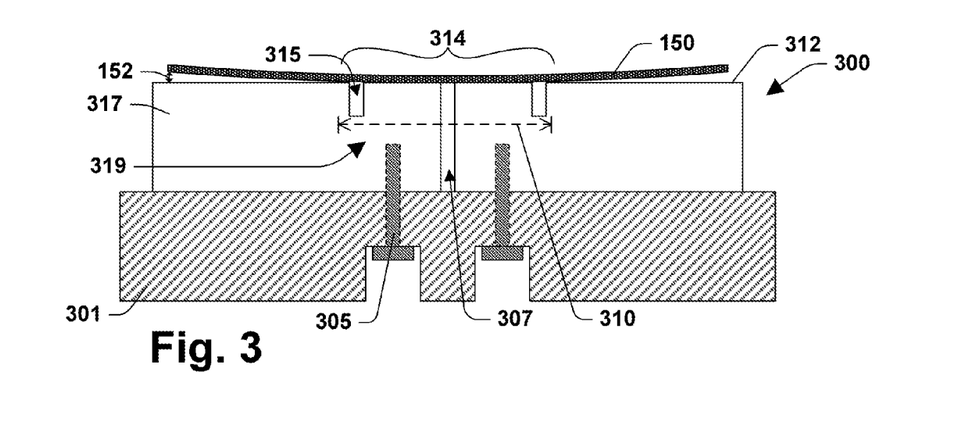
Figure 4:
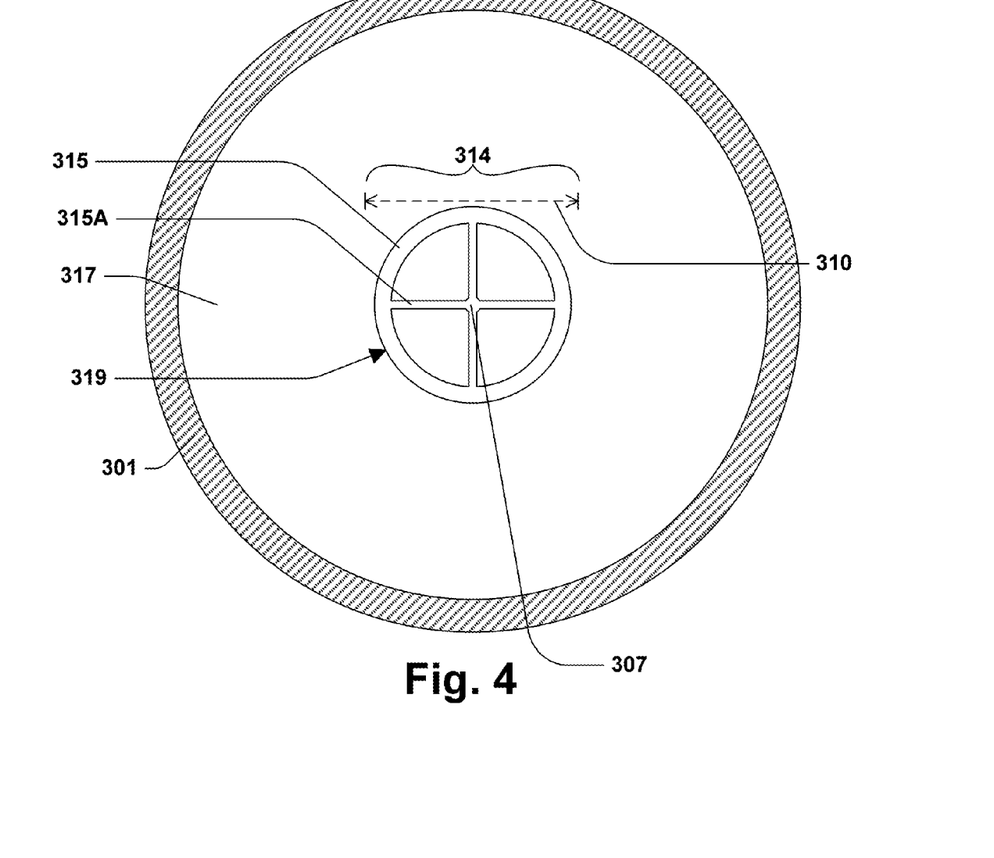
FIG. 4 provides a top view of the positioning table of FIG. 3.

FIG. 2 provides a flow chart of a method 200 that provides an example according to another embodiment of the present disclosure. The method 200 is a method of operating a grinding system such as grinding system 100. The method begins with act 201, placing a wafer 150 on positioning table 300. In some embodiments, this act is accomplished by having robot pick 120 draw a wafer 150 from a cassette 160 and place the wafer 150 on positioning table 300. FIG. 3 provides a cross-sectional side view showing some distinctive features of positioning table 300 in greater detail. Positioning table 300 provides an example according to another embodiment of the present disclosure. FIG. 4 provides a top view of positioning table 300.

Act 203 is drawing a vacuum through a vacuum manifold 319 formed in an upper portion 317 of positioning table 300. Vacuum manifold 319 opens onto a wafer-supporting upper surface 312 of positioning table 300. Drawing the vacuum creates a vacuum surface within a central region 314 of upper surface 312 sucking the wafer 150 firmly against positioning table 300. In some embodiments, positioning table 300 spins the wafer 150 to facilitate accurate and precise determination of the wafer 150's position. In these embodiments, the suction force applied by positioning table 300 is sufficient to prevent the wafer 150 from moving relative to upper portion 317 of positioning table 300 while the wafer 150 is being spun.

Vacuum manifold 319 includes trenches 315 and a hole 307. The various portions of vacuum manifold 319 are interconnected by passages such as the trenches 315A shown in FIG. 4. A vacuum pump (not shown) connects to vacuum manifold 319 through, for example, through hole 307. Developing a sufficiently low pressure within vacuum manifold 319 to secure a wafer 150 against surface 312 generally requires that a seal form between the wafer 150 and all of the opening of vacuum manifold 319 onto surface 312. In this example, the openings are where trenches 315 and hole 307 meet surface 312 within central region 314.

According to an embodiment of the present disclosure, vacuum manifold 319 has openings onto surface 312 that are exclusively within central region 314, which is a circular area having diameter 310. Diameter 310 is much smaller than the diameters of wafers 150 that grinding system 100 is designed to process. In FIG. 3, a bowed wafer 150 is shown resting on upper surface 312 of positioning table 300. The maximum height 152 of the wafer 150 above surface 312 within central region 314 is much less than the height 152 near the periphery of the wafer 150. The maximum height 152 of the wafer 150 above surface 312 within central region 314 becomes smaller as diameter 310 of central region 314 is made smaller. By making central region 314 sufficiently small in relation to such factors as the bow of wafer 150, the pliability of the material forming surface 312, the pliability of wafer 150, and the viscosity and surface tension of any liquid present on the surface 312, a seal can form between the wafer 150 and the vacuum manifold 319 in spite of the wafer 150's bow. In some embodiments, the tolerance of grinding system 100 for the bow of wafers 150 is further increased by forming surface 312 from an elastomeric material.

In some embodiments, the diameter of central region 314 is less than half the diameter of wafer 150. In most embodiments, diameter 310 of central region 314 is one fourth or less the diameter of wafer 150. In some embodiments, diameter 310 is less than 10 cm. In most embodiments, diameter 310 is 5 cm or less, e.g., 42 mm. In some embodiments, the maximum of height 152 within central region 314 is 0.4 mm or less. In most embodiments, the maximum of height 152 within central region 314 is 0.2 mm or less. In some embodiments, the maximum of height 152 within central region 314 is less than half the bow of wafer 150. In most embodiments, the maximum of height 152 within central region 314 is one fourth or less the bow of wafer 150. The bow of wafer 150 can be defined as the minimum distance between two parallel planes enclosing all points on one side of the wafer 150. A roughly equivalent definition is the minimum distance between two parallel planes between which the wafer 150 will fit, less the thickness of wafer 150.

According to another embodiment of the present disclosure, surface 312 is free of any orifices, depressions, or recesses that are not contiguous with vacuum manifold 319. This design minimizes the accumulation of contaminants on surface 312 and thereby minimizes contamination of wafers 150. Upper portion 317 of positioning table 300 is affixed to a frame 301 by screws 305. In some embodiments, screws 305 enter upper portion 317 from below as shown in FIG. 3, which configuration avoids the presence of screw openings or screw tops on the surface 312. Debris can be removed from orifices, depressions, and other recesses that are contiguous with vacuum manifold 319 by drawing air through vacuum manifold 319. In some embodiments, grinding system 100 is further adapted to reverse the flow of air through vacuum manifold 319 and blow air outwards from surface 312, which provides an additional method of clearing debris from the surface 312.

Figure 5:
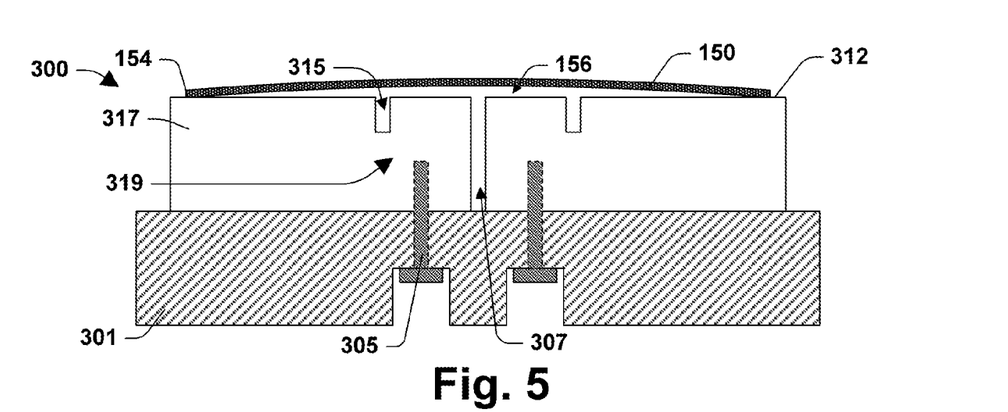
FIG. 5 provides a cross-sectional view from the side of the positioning table of FIG. 3 with a downwardly bowed wafer placed on top of it.

In most embodiments, positioning table 300 is adapted to hold wafers 150 whether they are bowed upwards or bowed downwards. FIG. 5 illustrates embodiments in which the surface 312 of positioning table 300 is larger than a wafer 150. In these embodiments, a vacuum seal forms between surface 312 and wafer 150 at wafer 150's perimeter 154. In these embodiments, the entire space 156 between wafer 150 and surface 312 comes under vacuum.

Figure 6:
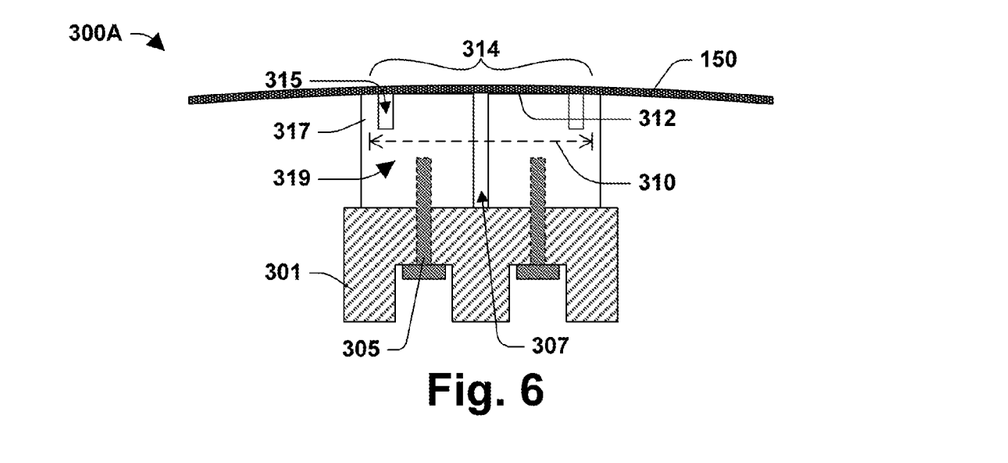
FIG. 6 illustrates a positioning table according to another embodiment of the present disclosure.

FIG. 6 illustrates a positioning table 300A, which is an example of alternate embodiments in which the diameter of surface 312 is circular and less than the diameter of the largest wafers 150 that grinding system 100 processes. In some of these embodiments, the diameter of surface 312 is not much greater than the diameter 310 of central region 314. In some embodiments, the diameter of surface 312 is about 10 cm or less. In some of these embodiments, the diameter of surface 312 is about 5 cm or less. In some embodiments, the diameter of surface 312 is half or less the diameter of wafers 150. In some of these embodiments, the diameter of surface 312 is one fourth or less the diameter of wafers 150. These embodiments facilitate forming a vacuum seal between a wafer 150 that is bowed downward and surface 312 by reducing the space 154 between surface 312 and a downwardly bowed wafer 150 and by reducing the path length along which a vacuum seal must form. A further advantage of these embodiments is that they increase the ability of grinding system 100 to tolerate radial asymmetry in the bowing of wafers 150.

Still referring to FIG. 2, act 205 is determining the position of the center of a wafer 150 while it is held on surface 312 of positioning table 300. In some embodiments, the position is determined using one or more photo-detectors or cameras. In some embodiments, positioning table 300 includes a rotatable mounting and the position of wafer 150 is sensed while positioning table 300 spins the wafer 150.

Act 207 is having robot 400 pick up wafer 150 from positioning table 300. In most embodiments, robot 400 includes an arm 407 having a suction board 401 attached to its effector end. Suction board 401 has a flat-faced wafer-sucking side 402 (not shown, but identified in FIG. 7) that enables suction board 401 to form a vacuum seal on a face of wafers 150 and thereby lift and hold wafers 150 by suction. In most embodiments, act 207 involves using the position information acquired in act 205 to instruct the decent of arm 407 onto the wafer 150 while the wafer 150 is still on positioning table 300. The position information enables robot arm 407 to pick up the wafer 150 with suction board 401 in a specified position relative to the wafer 150. The specified position is typically a position that has suction board 401 centered on wafer 150. Having wafer 150 in a specified position on suction board 401 allows robot 400 to center wafer 150 on chuck table 500.

In some other embodiments, robot 400 always descends at the same location on positioning table 300. In most of these other embodiments, positioning table 300 is adapted to translate the wafer 150 in directions perpendicular to the surface 312 and repositions the wafer 150 so that robot 400 will pick up wafer 150 in a specified position. In alternative embodiments, robot 400 centers wafer 150 on chuck table 500 by using the position information to adjust the location at which suction board 401 descends onto chuck table 500.

Figure 7:
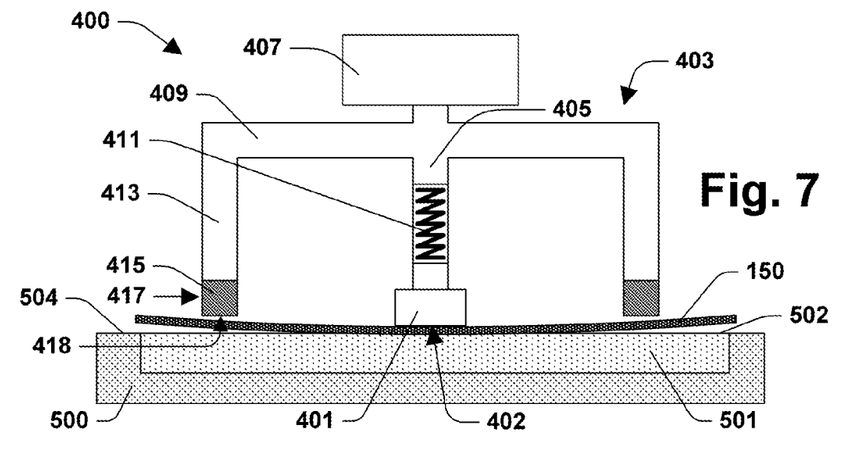
FIG. 7 provides a cross-sectional view from the side of a robot arm according to an embodiment of the present disclosure as the robot arm brings a wafer into contact with a table.
Figure 10:
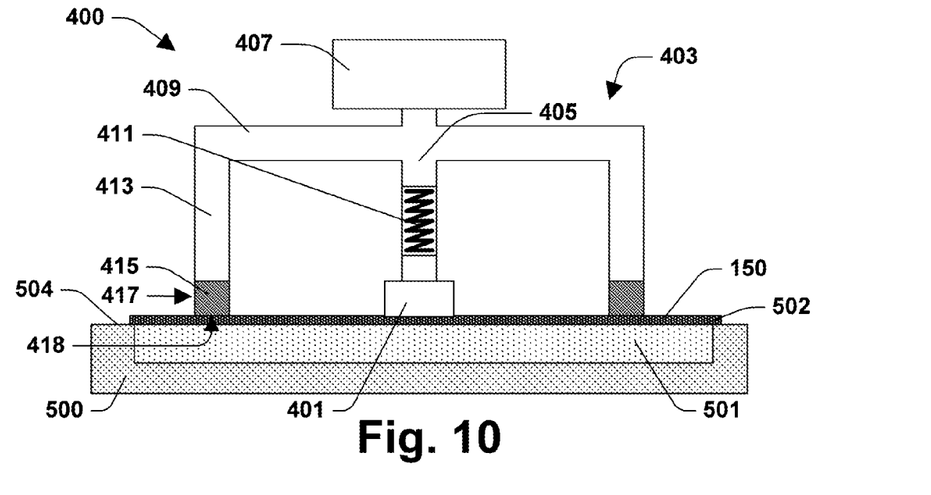
FIG. 10 illustrates the robot arm of FIG. 7 as it presses a wafer against a table.

Act 209 is lowering the wafer 150 into contact with an upper surface 504 of chuck table 500 as shown in FIG. 7. Act 211 is pressing wafer 150 against chuck table 500 using pusher 403 attached to arm 407 of robot 400. Act 213 is holding the wafer 150 against chuck table 500 by suction. As shown in FIG. 10, pressing wafer 150 against chuck table 500 can somewhat flatten the wafer 150 and engage or further engage the vacuum applied by act 213. These acts can be overlapping and their order varied. For example, a vacuum can be turned on prior to pressing wafer 150 against chuck table 500. Referring to FIG. 7, suction board 401 and pusher 403 are attached to effector end 405 of arm 407 of robot 400. Pusher 403 includes a supporting frame 409, frame extensions 413, and pusher tip 417. Frame extensions 413 hold pusher tip 417 so that contact surfaces 418, which are at the distal end of pusher tip 417, are disposed about the periphery of suction board 401.

Figure 8:
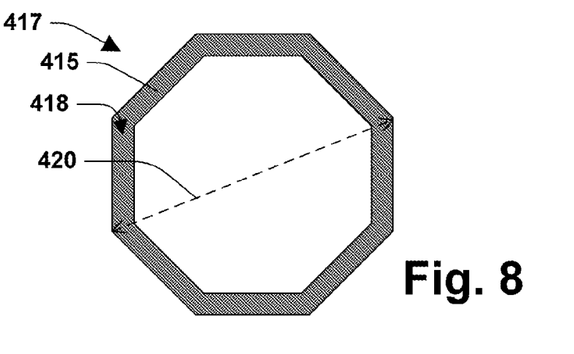
FIG. 8 provides a view from below showing the shape of the tip of the pusher on the robot arm of FIG. 7.
Figure 9:
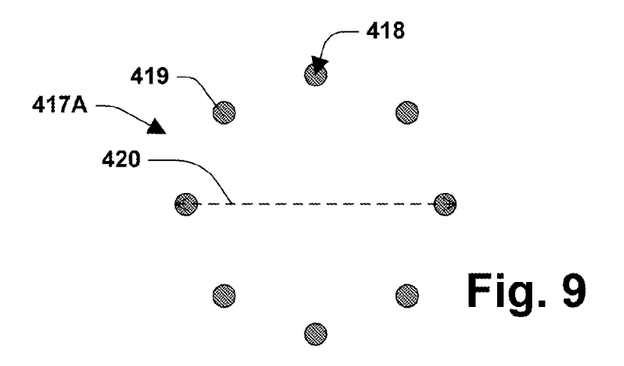
FIG. 9 illustrates the tip shape for a pusher according to another embodiment of the present disclosure.

In this example pusher tip 417 is an octagonal arrangement of eight connected pusher bars 415 as shown in FIG. 8. More generally, pusher tip 417 can have any suitable structure. Examples of suitable structures for pusher tip 417 include, without limitation, various arrangements of pusher bars 415 providing line-shaped contact surfaces 418 for pressing against wafer 150 and pillars 419 providing dot-shaped contact surfaces 418 for pressing against wafer 150. FIG. 9 illustrates pusher tip 417A, which provides an example of embodiments in which pusher tip 417 is formed by pillars 419.

In most embodiments, the structure of pusher tip 417 is symmetrical about a central point where suction board 401 is located. In some embodiments, pusher tip 417 includes a circular or polygonal arrangement of pusher bars 415. The bars can be connected as shown in FIG. 8, or disconnected. In some embodiments, pusher tip 417 is formed of pillars 419. In some embodiments, pusher tip 417 includes a circular or polygonal arrangement of pillars 419. These arrangements place contact surfaces 418 symmetrically about and displaced from suction board 401. In some embodiments, pusher tip 417 is formed of pusher bars 415 or pillars 419 that are equidistant from the center of suction board 401. In some embodiments, pusher tip 417 includes a multiplicity of the foregoing structures concentrically arranged to improve handling of wafers 150 having various sizes. In some embodiments, pusher tip 417 is formed from elements such as pusher bars 415 and pillars 419 that individually have widths (or diameters) in the range from 2 mm to 50 mm, e.g., 10 mm.

In some embodiments, pusher tip 417 is arranged to press on a wafer 150 near its perimeter 154. In some embodiments, pusher tip 417 spans a width 420 that is at least about 75% the diameter of wafers 150. A common wafer size is 200 mm. Accordingly, in some embodiments pusher tip 417 spans a width 420 that is at least 150 mm, e.g., 200 mm. Another typical size wafer size is 300 mm. 450 mm diameter wafer are expected to become common. Accordingly, in some embodiments, pusher tip 417 spans a width 420 that is at least 225 mm and in some embodiments pusher tip 417 spans a width 420 that is in the range from about 330 mm to about 450 mm. Arranging the pusher tip 417 to act on wafers 150 near their perimeters increases the effectiveness of pusher 403 in reducing the bow of wafers 150.

Supporting frame 409 and frame extensions 413 can be structured in any suitable way for driving pusher tip 417. In some embodiments, frame 409 includes a platen having a shape that overshadows pusher bars 415, pillars 419, and any other structures forming pusher tip 417. This structure can facilitate applying force uniformly across pusher tip 417.

In most embodiments, robot 400 holds the wafer 150 for lifting and carrying using suction applied through a suction board 401. Robot 400 may not hold wafer 150 as securely as positioning table 300 or chuck table 500. In some embodiments, to avoid potentially dislodging a wafer 150, robot 400 is designed to avoid contact between wafer 150 and pusher 403 when robot arm 407 is lifting the wafer 150. FIG. 7 provides an example of these embodiments, in that wafer 150 is shown contacting chuck table 500 before pusher 403 contacts the wafer 150. In some alternate embodiments, pusher 403 contacts wafer 150 while robot 400 is lifting wafer 150, but exert little or no force on the wafer 150 while in the lifted position.

In most embodiments, robot 400 is designed to permit some relative motion between pusher tip 417 and suction board 401. In some embodiments, relative motion is provided by flexion of pusher 403, which can occur for example in frame 409 or extensions 413. In some embodiments, for which FIG. 7 provides an example, relative motion is provided by one or more spring-loaded joints 411. FIG. 7 illustrates robot arm 407 with spring-loaded joint 411 in an uncompressed position. In this position, contact surfaces 418 of pusher tip 417 are above the plane of wafer-sucking face 402 of suction board 401. As arm 407 descends toward chuck table 500, spring-loaded joint 411 compresses until pusher 403 acts against wafer 150 and contact surfaces 418 of pusher tip 417 approach the plane of wafer-sucking face 402 as shown in FIG. 10. In some embodiments, pusher tip 417 is constructed of an elastomer or other material that yields to avoid placing excessive force on the wafer 150.

Chuck table 500 includes a pored structure 501 that forms a vacuum manifold and meets an upper surface 502 of chuck table 500 to form a vacuum surface 502. In some embodiments, the pored structure 501 is a ceramic, which provides good support during grinding operations. The larger the area of contact between vacuum surface 502 and wafer 150, the greater the suction force with which the wafer 150 can be held against the surface 504. Accordingly, in some embodiments vacuum surface 502 has a diameter that is nearly that of wafers 150.

Figure 11:
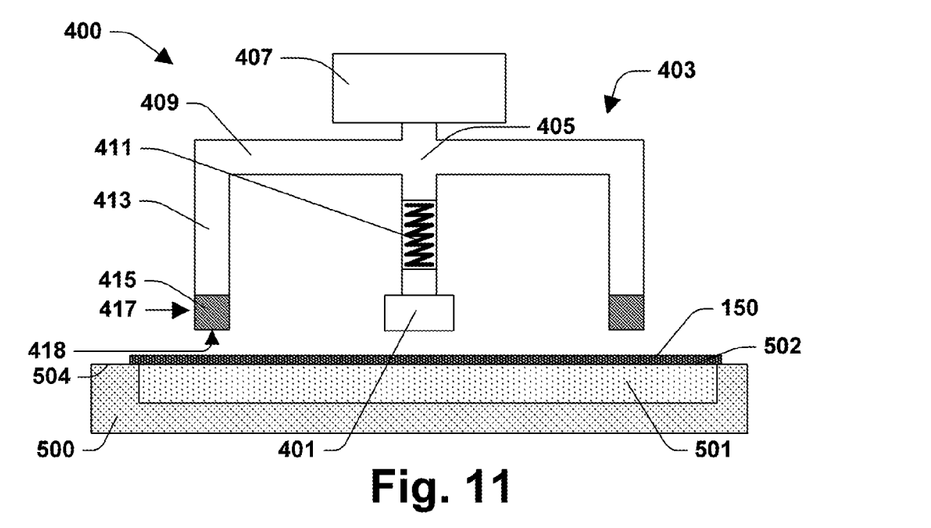
FIG. 11 illustrates the robot arm of FIG. 7 as it lifts away from a table against which the robot arm has pressed a wafer.

Without the action of pusher 403, contact between a wafer 150 and vacuum surface 502 may be insufficient to form a vacuum seal. As pusher 403 presses against the wafer 150, the wafer 150 flexes, reducing its bow, and increasing the effective contact area between the wafer 150 and vacuum surface 502. The increase in effective contact area can be sufficient to allow the vacuum between wafer 150 and chuck table 500 to develop. Once this vacuum has developed, robot arm 407 can release the wafer 150 and rise away from the wafer 150. Suction from chuck table 500 then holds the wafer 150 and maintains the wafer 150 in its unbowed state as shown in FIG. 11.

Process 200 of FIG. 2 continues with act 215, rotating carousel 130. Rotation places the wafer 150 just loaded at position 134 under the first grinding spindle 133A. Rotation also places a wafer 150 that has completed grinding under spindle 133C back at position 134. The ground wafer 150 will be unloaded and another wafer moved by robot 400 from positioning table 300 to the chuck table 500 now at position 134.

Act 217 is grinding the wafer 150. Grinding can take place by any suitable mechanism. In most embodiments, grinding spindles have abrasives on their lower surfaces (not shown) and are configured to spin. In some embodiments, chuck tables 500 are also configured to spin.

The present disclosure provides a wafer grinding system including a robot arm having a suction board at one end and a table within reach of the robot arm. The table has an upper surface for supporting a wafer thereon and a vacuum area for sucking and holding the wafer against the upper surface of the table. A pusher coupled to the robot arm extends about the periphery of the suction board. The pusher is configured to press the semiconductor wafers against the upper surface of the table. In some embodiments, the table is a chuck table. The wafer grinding system is operative to flatten wafers against the upper surface of the table. This facilitates forming a vacuum seal between the table and the wafer and increases the magnitude of wafer bow that can be tolerated by the grinding system.

The present disclosure also provides a wafer grinding system having a table having an upper surface for supporting a wafer thereon and a vacuum manifold for sucking and holding the wafer against the table. The vacuum manifold opens onto the upper surface of the positioning table exclusively through orifices that are within a vacuum area on the upper surface. The vacuum area is small in comparison to the area of the upper surface of the table or is small in comparison to the size of the wafers the grinding system is designed to process. In some embodiments, the table is a positioning table. In some embodiment, the upper surface of the positioning table is characterized by the absence of any indentations or orifices that are not connected to the vacuum manifold. The small vacuum area facilitates forming a vacuum seal between the table and a bowed wafer and increases the magnitude of wafer bow that can be tolerated by the grinding system.

The present disclosure also provides a wafer handling method. The method includes lifting a wafer from a first table to a second table using a robot arm that holds the wafer at a centralized position using a suction board. With the wafer still in contact with the suction board, the wafer is pressed against the second table using a pusher attached to the robot arm. The pusher presses against the wafer at positions outside the centralized position at which the suction board contacts the wafer. This flattens the wafer against the table and can allow the table to hold by suction a wafer that would otherwise be too bowed to be held by the table in that way.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. A wafer handling system, comprising:
a robot arm having a suction board at one end;
a table positioned within reach of the robot arm, the table having an upper surface for supporting a wafer thereon, the upper surface having a vacuum area for sucking and holding the wafer against the upper surface of the table; and
one or more pushers coupled to the robot arm and extending about a periphery of the suction board;
wherein the one or more pushers are configured to press a semiconductor wafer held by the suction board against the upper surface of the table.

2. The system of claim 1, wherein the table is a chuck table within a wafer grinding system.

3. The system of claim 1, further comprising:
a spring-loaded connecting piece between the suction board and the one or more pushers;
wherein the spring-loaded connecting piece allows relative motion between the suction board and the one or more pushers.

4. The system of claim 3, wherein:
the suction board has a flat-faced wafer-sucking side;
the spring-loaded connecting piece has a compressed position in which tips of the one or more pushers are in a same plane as the flat-faced wafer-sucking side of the suction board; and
the spring loading connecting piece has a decompressed position in which the one or more pushers do not reach the plane of the flat-faced wafer-sucking side of the suction board.

5. The system of claim 1, wherein:
the suction board has a flat-faced wafer-sucking side; and
the one or more pushers include a platen attached to the robot arm, and further include extensions attached to the platen and extending in a direction faced by the wafer-sucking side of the suction board.

6. The system of claim 1, wherein:
the suction board has a flat-faced wafer-sucking side; and
the one or more pushers comprises a plurality of pusher bars oriented parallel to the flat-faced wafer-sucking side of the suction board.

7. The system of claim 1, further comprising:
a positioning table having an upper surface for supporting a wafer thereon and a vacuum manifold for sucking and holding the wafer against the positioning table;
wherein the vacuum manifold opens onto the upper surface of the positioning table exclusively through orifices that are within a vacuum area on the upper surface of the positioning table; and
wherein the vacuum area has a smaller width than that of the upper surface of the positioning table.

8. The system of claim 1, further comprising:
a positioning table having an upper surface for supporting a wafer thereon and a vacuum manifold for sucking and holding the wafer against the positioning table;
wherein the vacuum manifold opens onto the upper surface of the positioning table exclusively through orifices that are within a vacuum area on the upper surface of the positioning table; and
wherein the vacuum area is restricted to within a circular region that is no more than about 50 millimeters (mm) in diameter.

9. The system of claim 1, further comprising:
a positioning table having an upper surface for supporting a wafer thereon and a vacuum manifold for sucking and holding the wafer against the positioning table;
wherein the upper surface of the positioning table is characterized by the absence of any indentations or orifices that are not connected to the vacuum manifold.

10. The system of claim 9, wherein an uppermost portion of the positioning table, which includes the upper surface of the positioning table, is attached to a wafer grinding system through screws that enter the uppermost portion of the positioning table through holes formed opposite the upper surface of the positioning table.

11. The system of claim 1, wherein the one or more pushers are configured to press an edge of the semiconductor wafer against the upper surface of the table.

12. A wafer handling system comprising:
a robot arm comprising a suction board at one end, the suction board configured to hold a wafer;
a table within reach of the robot arm, wherein the table comprises an upper surface configured to support the wafer, and comprises a vacuum area configured to hold the wafer against the upper surface; and
a pusher coupled to the robot arm and extending about a periphery of the suction board, wherein the pusher is configured to press a periphery of the wafer against the upper surface of the table.

13. The system of claim 12, wherein the robot arm comprises a spring-loaded joint configured to allow the suction board to deflect relative to the pusher.

14. The system of claim 12, further comprising:
a positioning table comprising an upper surface configured to support the wafer, and comprising a vacuum manifold configured to hold the wafer against the upper surface of the positioning table, wherein the vacuum manifold is arranged at a center of the upper surface of the positioning table and is configured with a width less than about a half of a width of the wafer, and wherein the upper surface of the positioning table is substantially planar but for orifices of the vacuum manifold.

15. The system of claim 12, further comprising:
a positioning table comprising a frame and an upper portion, the upper portion arranged over the frame and comprising an upper surface configured to support the wafer, and wherein the frame and the upper portion are connected by fasteners covered by the upper surface of the upper portion.

16. The system of claim 12, further comprising:
a carousel comprising the table and an additional table; and
a spindle arranged above the carousel, and configured to grind the wafer;
wherein the carousel is configured to rotate the carousel to move the wafer to the spindle.

17. A wafer handling system comprising:
a carousel supporting a first table, wherein the carousel is configured to rotate about a central axis, and wherein the first table is laterally offset from the central axis, is configured to support a wafer, and comprises a vacuum area configured to hold the wafer against the first table;
a second table arranged laterally adjacent to the carousel, wherein the second table comprises an upper surface configured to support the wafer, and further comprises a vacuum manifold configured to hold the wafer against the upper surface, wherein the vacuum manifold is arranged at a center of the upper surface and comprises a trench in the upper surface, and wherein the vacuum manifold has a width less than about a half of a width of the wafer; and a robot arm within reach of the first and second tables, and configured to move the wafer between the first and second tables.

18. The system of claim 17, further comprising:

a suction board arranged at an end of the robot arm and configured to hold the wafer; and one or more pushers coupled to the robot arm and extending about a periphery of the suction board, wherein the one or more pushers are configured to press the wafer against an upper surface of the first table.

19. The system of claim 17, wherein the vacuum manifold comprises a hole in the upper surface of the second table, wherein the trench is ring shaped and laterally surrounds the hole, and wherein a second trench is arranged in the upper surface of the second table and extends laterally from the trench to the hole.

20. The system of claim 17, wherein the second table comprises a non-porous body, and wherein the non-porous body comprises the vacuum manifold and defines the upper surface of the second table.

* * * * *